United States Patent
Ishii et al.

(10) Patent No.: US 8,460,563 B2
(45) Date of Patent: Jun. 11, 2013

(54) PRODUCING METHOD OF WIRED CIRCUIT BOARD

(75) Inventors: Jun Ishii, Osaka (JP); Hitoki Kanagawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 527 days.

(21) Appl. No.: 12/453,243

(22) Filed: May 4, 2009

(65) Prior Publication Data

US 2009/0277868 A1    Nov. 12, 2009

Related U.S. Application Data

(60) Provisional application No. 61/071,720, filed on May 14, 2008.

(30) Foreign Application Priority Data

May 9, 2008    (JP) .................................. 2008-123613

(51) Int. Cl.
*H05K 3/17*    (2006.01)
*H05K 3/06*    (2006.01)

(52) U.S. Cl.
USPC .......................................................... 216/13

(58) Field of Classification Search
USPC .......................................................... 216/13
See application file for complete search history.

(56) References Cited

U.S. PATENT DOCUMENTS

| 5,858,518 | A |  | 1/1999 | Omote et al. |
| 6,096,482 | A |  | 8/2000 | Omote et al. |
| 6,100,582 | A |  | 8/2000 | Omote et al. |
| 7,554,643 | B2 | * | 6/2009 | Yamada ......................... 349/150 |
| 7,679,174 | B1 | * | 3/2010 | Okada et al. ................... 257/679 |
| 2001/0051707 | A1 | * | 12/2001 | Fukuoka et al. .............. 528/338 |
| 2003/0026078 | A1 |  | 2/2003 | Komatsubara et al. |
| 2005/0122627 | A1 | * | 6/2005 | Kanagawa et al. ........ 360/245.9 |
| 2005/0282088 | A1 | * | 12/2005 | Aonuma et al. .............. 430/311 |

FOREIGN PATENT DOCUMENTS

| JP | 10-265572 | 10/1998 |
| JP | 2001-251049 | 9/2001 |
| JP | 2001-358257 | 12/2001 |
| JP | 2003-31915 | 1/2003 |
| JP | 2003-101195 | 4/2003 |

* cited by examiner

*Primary Examiner* — Binh X Tran
*Assistant Examiner* — Thomas Pham
(74) *Attorney, Agent, or Firm* — Jean C. Edwards, Esq.; Edwards Neils PLLC

(57) ABSTRACT

A producing method of a wired circuit board includes a laminating step of preparing a metal supporting board, forming an insulating base layer on the metal supporting board, forming a conductive layer including a terminal portion and a plating lead continued from the terminal portion on the insulating base layer, and forming an insulating cover layer on the insulating base layer so as to cover the conductive layer, a first etching step of etching the metal supporting board, and then etching the insulating base layer to expose the plating lead from the metal supporting board and the insulating base layer, and a second etching step of etching the exposed plating lead.

4 Claims, 6 Drawing Sheets ic # PRODUCING METHOD OF WIRED CIRCUIT BOARD

CROSS-REFERENCE TO RELATED APPLICATION

The present application claims priority from U.S. Patent Provisional Application No. 61/071,720 filed on May 14, 2008, and also claims priority from Japanese Patent Application No. 2008-123613 filed on May 9, 2008, the content of each of which is hereby incorporated by reference into this application.

BACKGROUND OF THE INVENTION

1. Field of the Invention

The present invention relates to a producing method of a wired circuit board and, more particularly, to a producing method of a wired circuit board which is preferably used for the production of a suspension board with circuit.

2. Description of the Related Art

In a hard disk drive, a suspension board with circuit is used in which a wired circuit pattern connected to a magnetic head is integrally formed in a suspension board for supporting the magnetic head. The suspension board with circuit includes the suspension board made of stainless steel, an insulating base layer formed thereon and made of polyimide, and a wired circuit pattern formed on the insulating base layer, and made of copper.

As a producing method of such a suspension board with circuit, a method has been proposed in which, in a suspension board with circuit wherein, e.g., a conductive pattern including terminal portions and lead portions is formed on an insulating layer made of polyimide and provided on a stainless steel foil base material, a covering layer is formed to cover the conductive pattern except for the terminal portions and the lead portions, electrolytic nickel plating and electrolytic gold plating are successively performed with respect to the terminal portions to form terminals, and then the lead portions are removed by chemical etching (see, e.g., Japanese Unexamined Patent Publication No. 10-265572).

SUMMARY OF THE INVENTION

However, in the method described in Japanese Unexamined Patent Publication No. 10-265572, the step of removing the lead portions by chemical etching is provided as an independent step and, after the lead portions are removed in the step, the stainless steel foil base material is punched out into a predetermined shape by chemical etching.

On the other hand, the production of a wired circuit board generally requires numerous steps, so that a reduction in the number of steps is desired.

It is therefore an object of the present invention to provide a producing method of a wired circuit board in which the number of steps is reduced to allow an improvement in production efficiency.

A producing method of a wired circuit board of the present invention includes a laminating step of preparing a metal supporting board, forming an insulating base layer on the metal supporting board, forming a conductive layer including a terminal portion and a plating lead continued from the terminal portion on the insulating base layer, and forming an insulating cover layer on the insulating base layer so as to cover the conductive layer, a first etching step of etching the metal supporting board, and then etching the insulating base layer to expose the plating lead from the metal supporting board and the insulating base layer, and a second etching step of etching the exposed plating lead.

In the method, the plating lead is exposed from the metal supporting board and the insulating base layer in the first etching step, and then the plating lead is etched in the second etching step.

As a result, when the terminal portion is formed as a flying lead, e.g., it is possible to perform the first etching step to expose the plating lead simultaneously with the step of exposing the terminal portion from the metal supporting board, and then perform the second etching step to etch the plating lead simultaneously with a step of trimming the metal supporting board.

As a result, it is unnecessary to provide a step of removing the plating lead as an independent step so that the number of steps is reduced to allow an improvement in production efficiency.

In the producing method of the wired circuit board of the present invention, it is preferable that, in the first etching step, the metal supporting board is etched inside a range in which the insulating base layer is formed when the insulating base layer is projected in a layer thickness direction.

In the method, around the periphery of an opening formed in the metal supporting board in the first etching step, the insulating base layer is laminated on the metal supporting board. Accordingly, in the second etching step, the insulating base layer covers the upper surface of the metal supporting board around the periphery of the opening.

As a result, it is possible to prevent the upper surface of the metal supporting board around the periphery of the opening from being etched together with the plating lead.

In the producing method of the wired circuit board of the present invention, it is preferable that the insulating base layer has a stepped portion corresponding to the plating lead.

In the method, the stepped portion of the insulating base layer is formed thin. As a result, the thickness of the insulating base layer to be etched in the first etching step is small, and an etching time can be reduced.

This allows a further improvement in production efficiency.

In the producing method of the wired circuit board of the present invention, it is preferable that, in the laminating step, the insulting cover layer is formed so as to expose the terminal portion, and, in the first etching step, the terminal portion is exposed from the metal supporting board and the insulating base layer at the same time as the plating lead is exposed, the producing method of the wired circuit board further including, after the first etching step and before the second etching step, a plating step of plating the exposed terminal portion with power supplied from the plating lead.

In the method, the insulating cover layer is formed in the laminating step to expose the terminal portion, the terminal portion is exposed at the same time as the plating lead is exposed in the first etching step, the exposed terminal portion is plated with power supplied from the plating lead in the plating step, and then the plating lead is etched in the second etching step.

As a result, it is possible to perform the first etching step to expose the plating lead simultaneously with the step of exposing the terminal portion from the metal supporting board to form the terminal portion as a flying lead, and then perform the second etching step to etch the plating lead simultaneously with the step of trimming the metal supporting board.

As a result, it is unnecessary to provide a step of removing the plating lead as an independent step, so that the number of steps is reduced to allow an improvement in production efficiency.

DETAILED DESCRIPTION OF THE INVENTION

Figure 1:
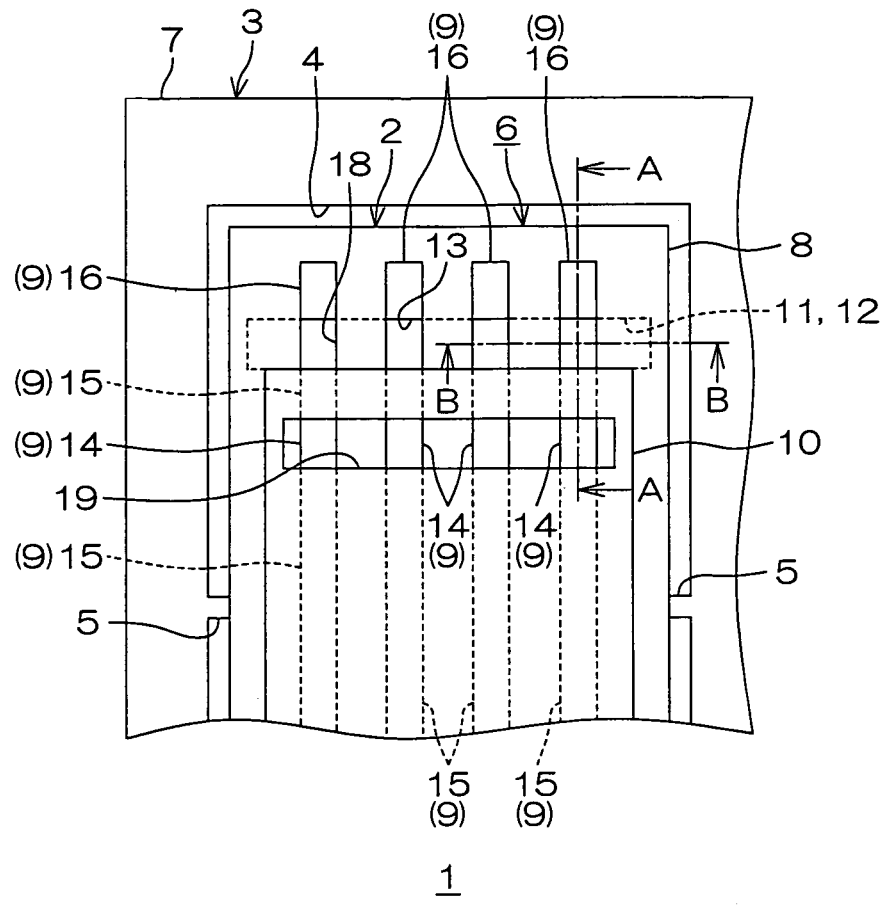
FIG. 1 is a plan view showing an embodiment of a wired circuit board assembly sheet formed with a plurality of wired circuit boards.

FIG. 1 is a principal-portion plan view showing an embodiment of a wired circuit board assembly sheet formed with a plurality of wired circuit boards.

FIG. 2(a) is an A-A cross-sectional view of the wired circuit board assembly sheet shown in FIG. 1, and FIG. 2(b) is a B-B cross-sectional view thereof.

Figure 3:
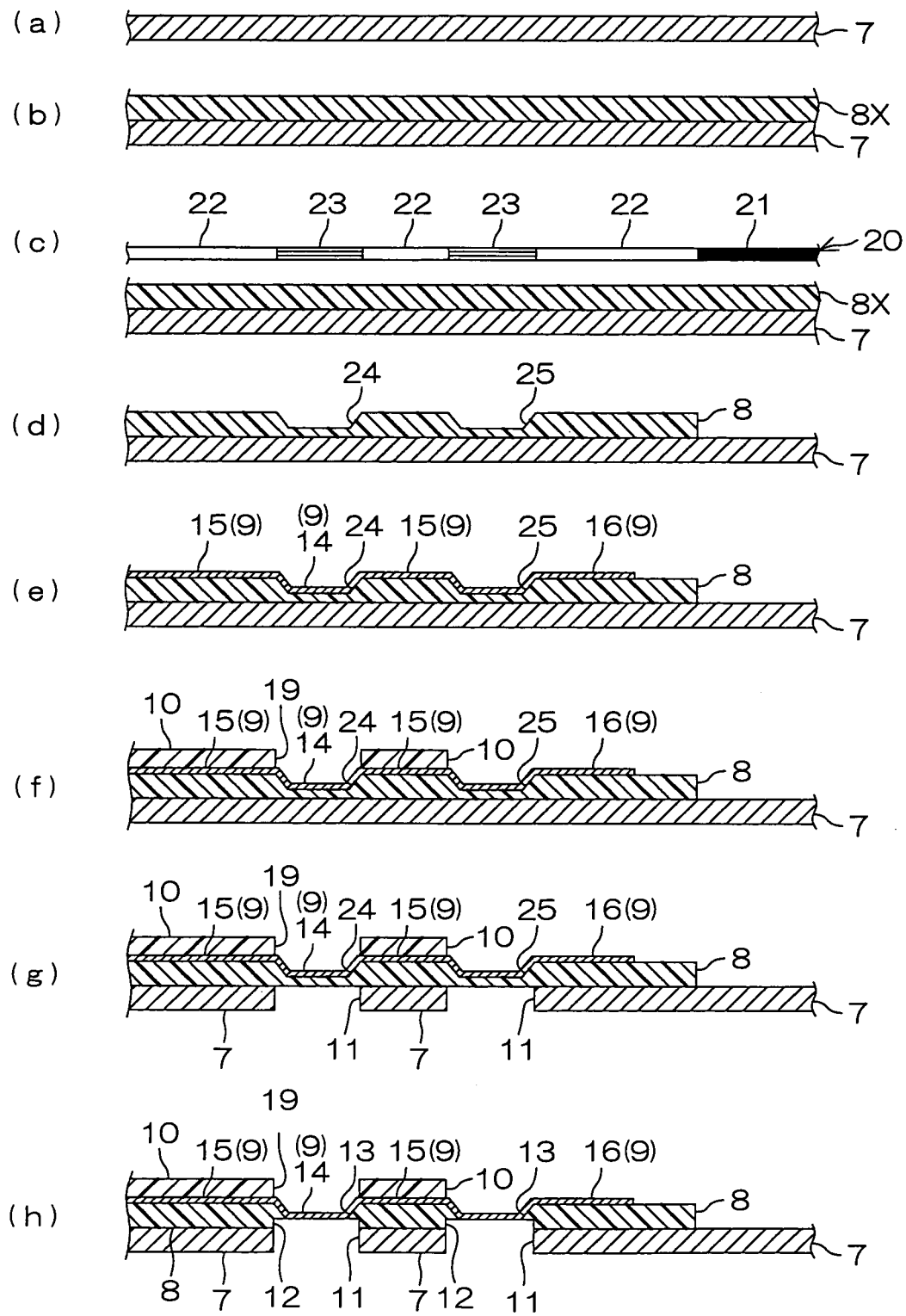
FIG. 3 is a production process view of the wired circuit board assembly sheet,
   (a) showing the step of preparing a metal supporting board,
   (b) showing the step of forming a coating of a precursor of photosensitive polyimide,
   (c) showing the step of exposing the coating of the precursor of photosensitive polyimide to light via a photomask,
   (d) showing the step of curing the coating of the precursor of photosensitive polyimide to form an insulating base layer,
   (e) showing the step of forming a conductive pattern,
   (f) showing the step of forming an insulating cover layer,
   (g) showing the step of etching the metal supporting board, and
   (h) showing the step of etching the insulating base layer.
Figure 4:
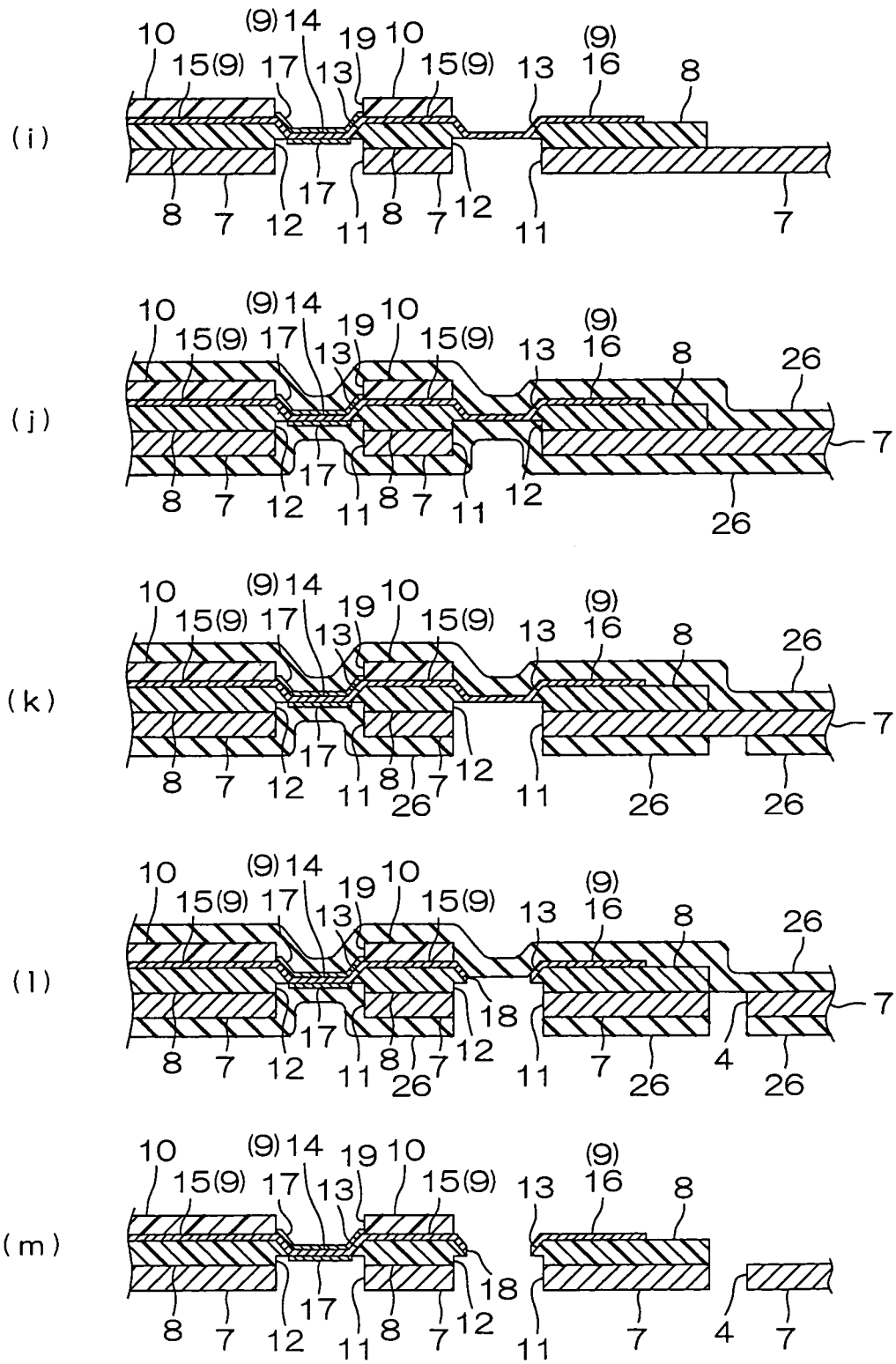
FIG. 4 is a production process view of the wired circuit board assembly, which is subsequent to FIG. 3,
   (i) showing the step of forming a metal plating layer,
   (j) showing the step of laminating a dry film photoresist,
   (k) showing the step of exposing the dry film photoresist to light, and developing the dry film photoresist,
   (l) showing the step of etching the plating lead together with the metal supporting board, and
   (m) showing the step of removing the dry film photoresist.

FIGS. 3 and 4 are production process views of the wired circuit board assembly sheet.

A wired circuit board assembly sheet 1 is formed of a metal supporting board 7 having an elongated flat plate shape, along a longitudinal direction (the up-and-down direction of FIG. 1; the same applies hereinafter) and along a widthwise direction (a direction perpendicular to both of the longitudinal direction and a thickness direction; the same applies hereinafter).

In the metal supporting board 7, a product formation region 2 for forming a suspension board with circuit 6 as the wired circuit board, and a supporting region 3 for supporting the suspension board with circuit 6 are defined. The product formation region 2 and the supporting region 3 are separated from each other in the longitudinal direction and the widthwise direction by a trench portion 4 formed along the outer periphery of the product formation region 2, and coupled to each other by a cuttable supporting portion 5.

The product formation regions 2 are each formed in a generally rectangular shape when viewed in plan view, and defined in spaced-apart relation along the longitudinal direction and the widthwise direction so as to correspond to a plurality of the suspension boards with circuits 6, though not shown.

The suspension board with circuit 6 is formed in the shape of an elongated flat plate extending in the longitudinal direction, which is defined as the product formation region 2. As shown in FIG. 2(a), the suspension board with circuit 6 includes a metal supporting board 7, an insulating base layer 8, a conductive pattern 9 as a conductive layer including terminals 14 as terminal portions, wires 15, and plating leads 16, and an insulating cover layer 10.

In the metal supporting board 7, two substrate-side openings 11 are formed correspondingly to the terminals 14 and the plating leads 16 so as to extend through the metal supporting board 7.

As shown in FIG. 1, the substrate-side opening 11 closer to the terminals 14 is formed in a generally rectangular shape extending along the widthwise direction so as to include all the terminals 14 when viewed in plan view.

The substrate-side opening 11 closer to the plating leads 16 is disposed, when viewed in plan view, to be spaced apart from the substrate-side opening 11 closer to the terminals 14 on the side closer to one longitudinal end portion of the suspension board with circuit 6. The substrate-side opening 11 closer to the plating leads 16 is formed in a generally rectangular shape extending along the widthwise direction in parallel with the substrate-side opening 11 closer to the terminals 14 so as to include all the plating leads 16.

The insulating base layer 8 is formed to have generally the same shape as that of the product formation region 2.

As shown in FIG. 2(a), the insulating base layer 8 is formed on the metal supporting board 7. The insulating base layer 8 has lower openings 12 and upper openings 13 which are formed correspondingly to the substrate-side openings 11.

The lower openings 12 are each formed in the lower portion in the thickness direction of the insulating base layer 8 so as to be of the same size and position as those of the substrate-side opening 11.

The upper openings 13 are each formed in the upper portion in the thickness direction of the insulating base layer 8 to have a shape similar to and smaller than that of the lower opening 12, and connect to the lower opening 12. The upper opening 13 is formed in a tapered shape having a width which gradually decreases in a downward direction.

The conductive pattern 9 is formed on the insulating base layer 8, and includes a plurality of (four) terminals 14, a plurality of (four) wires 15 formed continuously from the individual terminals 14 so as to correspond thereto, and a plurality of (four) plating leads 16 formed continuously from the individual terminals 14 so as to correspond thereto via the individual wires 15, as shown in FIG. 1.

Figure 2:
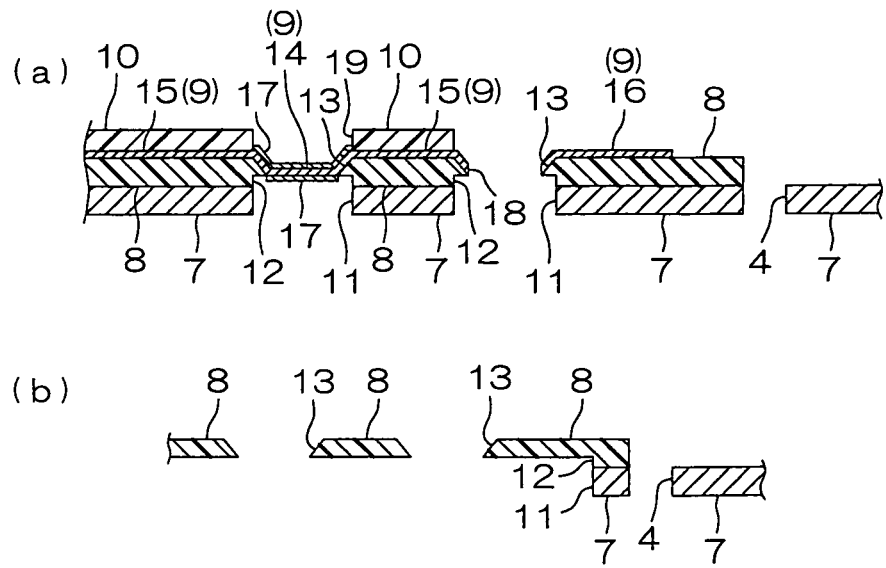
FIG. 2 shows the wired circuit board assembly sheet shown in FIG. 1,
   (a) showing an A-A cross-sectional view, and
   (b) showing a B-B cross-sectional view.

The terminals 14 are each formed in a generally rectangular shape when viewed in plan view, and disposed in spaced-apart relation along the widthwise direction. As shown in FIG. 2(*a*), each of the terminals 14 is formed as a flying lead having exposed upper and lower surfaces. That is, the terminal 14 fills the upper opening 13, while being laminated on the insulating base layer 8 around the upper opening 13 to have a center portion thereof which is formed downwardly depressed from the peripheral end portion thereof. The lower surface of the terminal 14 is disposed to be flush with the interface between the lower opening 12 and the upper opening 13 to be exposed from the lower opening 12 and the substrate-side opening 11. The upper surface of the terminal 14 is exposed from a cover-side opening 19 described later.

On the upper and lower surfaces of the exposed center portion of each of the terminals 14, a metal plating layer 17 is formed.

In FIG. 1, each of the terminals 14 is formed on one longitudinal end portion of the suspension board with circuit 6. However, the terminals 14 are also formed on the other longitudinal end portion of the suspension board with circuit 6. The terminals 14 on one longitudinal end portion and the terminals 14 on the other longitudinal end portion are connected by the individual wires 15.

As shown in FIG. 1, the wires 15 are disposed in spaced-apart relation along the widthwise direction, and formed along the longitudinal direction. The wires 15 are formed along the longitudinal direction so as to connect the terminals 14 on one longitudinal end portion and the terminals 14 on the other longitudinal end portion.

Each of the plating leads 16 is formed on one longitudinal end portion of the suspension board with circuit 6. As shown in FIG. 2(*a*), the plating lead 16 has one end portion formed on the insulating base layer 8, and the other end portion (end portion closer to the wire 15) formed to correspond to the upper opening 13 closer to the plating leads 16. That is, the other end portion of the plating lead 16 is formed continuously from one end portion of the plating lead 16 and from the wire 15 to be downwardly bent so as to cover the both longitudinal end surfaces of the upper opening 13 closer to the plating leads 16. The longitudinal center portion of the other end portion of each of the plating leads 16 is formed with a lead opening 18.

As shown in FIG. 1, each of the lead opening 18 is formed to have the same widthwise length as that of each of the plating leads 16 in the widthwise direction. That is, each of the lead opening 18 cuts the corresponding plating lead 16.

As shown in FIG. 1, the insulating cover layer 10 is formed on the insulating base layer 8 so as to cover each of the wires 15, and expose each of the terminals 14 and each of the plating leads 16.

When viewed in plan view, the insulating cover layer 10 is formed in a generally rectangular shape slightly smaller than the insulating base layer 8. That is, the both longitudinal end surfaces and the both widthwise end surfaces of the insulating cover layer 10 are formed inside the both longitudinal end surfaces and the both widthwise end surfaces of the insulating base layer 8 in the longitudinal direction and the widthwise direction. One longitudinal end surface of the insulating cover layer 10 is disposed on the other longitudinal side of each of the plating leads 16 so as to expose each of the plating lead 16.

The insulating cover layer 10 is formed with the cover-side opening 19 which exposes each of the terminals 14.

The cover-side opening 19 is formed to be of the same size and position as those of each of the substrate-side opening 11 closer to the terminals 14 and the lower opening 12 closer to the terminals 14. The cover-side opening 19 is formed also correspondingly to each of the terminals 14 on the other longitudinal end portion not shown.

Next, a producing method of the wired circuit board of the present invention is described with reference to FIGS. 3 and 4.

In the method, the metal supporting board 7, the insulating base layer 8, the conductive pattern 9, and the insulating cover layer 10 are formed first in a laminating step.

That is, in this step, the metal supporting board 7 is prepared first as shown in FIG. 3(*a*).

The metal supporting board 7 is formed of a sheet of metal such as, e.g., stainless steel, a 42-alloy, or copper. Preferably, stainless steel is used as the metal.

The thickness of the metal supporting board 7 is in a range of, e.g., 8 to 50 µm, or preferably 10 to 30 µm.

Then, in this step, the insulating base layer 8 is formed as shown in FIGS. 3(*b*) to 3(*d*).

Examples of an insulating material used to form the insulating base layer 8 include a synthetic resin such as polyimide, polyether nitrile, polyether sulfone, polyethylene terephthalate, polyethylene naphthalate, and polyvinyl chloride. Among them, a photosensitive synthetic resin is preferably used, or more preferably, photosensitive polyimide is used.

The insulating base layer 8 is formed in a predetermined pattern on the metal supporting board 7 using, e.g., photosensitive polyimide. More specifically, a solution of a precursor of photosensitive polyimide is coated first on the entire surface of the metal supporting board 7 as shown in FIG. 3(*b*), and then dried to form a coating 8X of the precursor of photosensitive polyimide.

Next, as shown in FIG. 3(*c*), the coating 8X of the precursor of photosensitive polyimide is subjected to gradation exposure via a photomask 20, and then developed to form a predetermined pattern. FIG. 3(*c*) shows an embodiment in which patterning is performed in a negative mode.

The photomask 20 is formed in a gradation pattern including light shielding portions 21, transmitting portions 22, and semi-transmitting portions 23.

The light shielding portions 21 shield light. The coating 8X of the precursor of photosensitive polyimide which is disposed under the light shielding portions 21 is not exposed to light so that it is removed by development.

The transmitting portions 22 transmit light. The coating 8X of the precursor of photosensitive polyimide which is disposed under the transmitting portions 22 is exposed to light, and remains even after development.

The semi-transmitting portions 23 partially transmit light. The coating 8X of the precursor of photosensitive polyimide which is disposed under the semi-transmitting portions 23 is exposed to light, and partially removed by development, while partially remaining.

The transmitting portions 22 are disposed to oppose the portions (except for the portions where the other end portion of each of the plating leads 16 and each of the terminals 14 are formed) where the insulating base layer 8 is to be formed. The semi-transmitting portions 23 are disposed to oppose the portions where the other end portion of each of the plating leads 16 and each of the terminals 14 are to be formed. The light shielding portions 21 are disposed to oppose the other portions. Then, the coating 8X of the precursor of photosensitive polyimide is exposed to light, and developed.

Thereafter, the patterned coating 8X is cured (imidized) by heating so that the insulating base layer 8 made of polyimide is formed in a predetermined pattern.

As a result, as shown in FIG. 3(d), the portions opposing the light shielding portions 21 are removed so that the insulating base layer 8 is formed on the portions opposing the transmitting portions 22. Of the insulating base layer 8, the portions opposing the semi-transmitting portions 23 are formed thinner than the portions opposing the transmitting portions 22 so that lead-side depressed portions 25 as stepped portions and terminal-side depressed portions 24 corresponding individually to the other end portions of the individual metal leads 16 and to the individual terminals 14.

In the method described above, the photomask 20 in the gradation pattern 20 is used. However, it is also possible to use a plurality of the photomasks 20 having different patterns (e.g., a pattern for exposing the portions where the terminal-side depressed portions 24 and the lead-side depressed portions 25 are to be formed, and a pattern for not exposing these portions), and successively perform at least two or more exposure sessions to form the terminal-side depressed portions 24 and the lead-side depressed portions 25.

When a photosensitive resin is not used in the formation of the insulating base layer 8, a resin may be laminated appropriately as a coating or a dry film in a predetermined pattern on the metal supporting board 7, for example. In this case, to form the terminal-side depressed portions 24 and the lead-side depressed portions 25 which are thinner than the other portion of the insulating base layer 8, the lamination of a resin is performed in a plurality of separate steps, and the number of lamination steps for the terminal-side depressed portions 24 and the lead-side depressed portions 25 is set smaller than that of lamination steps for the other portion, for example.

The thickness of the insulating base layer 8 (except for the portions where the terminal-side depressed portions 24 and the lead-side depressed portions 25 are formed) is in a range of, e.g., 3 to 20 μm, or preferably 4 to 12 μm.

In the insulating base layer 8, the thicknesses of the portions where the terminal-side depressed portions 24 and the lead-side depressed portions 25 are formed are in a range of, e.g., 1 to 7 μm, or preferably 2 to 5 μm. The longitudinal length of the terminal-side depressed portion 24 is in a range of, e.g., 0.1 to 5 mm, or preferably 0.3 to 4 mm, and the widthwise length thereof is in a range of, e.g., 0.1 to 2 mm, or preferably 0.2 to 1 mm. The longitudinal length of the lead-side depressed portion 25 is in a range of, e.g., 0.03 to 0.5 mm, or preferably 0.05 to 0.2 mm, and the widthwise length thereof is in a range of, e.g., 0.02 to 0.5 mm, or preferably 0.03 to 0.5 mm.

Next, in this step, the conductive pattern 9 is formed on the insulating base layer 8, as shown in FIG. 3(e).

Examples of a material used to form the conductive pattern 9 include copper, nickel, gold, a solder, and an alloy thereof. Preferably, copper is used.

To form the conductive pattern 9, the conductive pattern 9 is formed on the surface of the insulating base layer 8 by a known patterning method such as, e.g., a subtractive method or an additive method. Among these patterning methods, the additive method is preferably used.

In the subtractive method, a metal layer is laminated first on the surface of the insulating base layer 8 via an adhesive layer as necessary. Then, an etching resist is formed thereon in correspondence to the conductive pattern 9. Subsequently, the metal layer is etched, and then the etching resist is removed.

In the additive method, a metal thin film serving as a seed film is formed first on the insulating base layer 8. The metal thin film is formed of chromium, nickel, copper, or an alloy thereof by a thin-film formation method such as a sputtering method. Then, a plating resist is formed in a pattern reverse to the conductive pattern 9 on the surface of the metal thin film.

The plating resist is formed of a dry film photoresist or the like by a known method involving exposure and development. Thereafter, the conductive pattern 9 is formed on the surface of the metal thin film exposed from the plating resist. The conductive pattern 9 is formed by, e.g., electrolytic plating, or preferably electrolytic copper plating. Thereafter, the metal resist is removed by etching or stripping, and then the metal thin film exposed from the conductive pattern 9 is removed by etching.

Each of the terminals 14 of the conductive pattern 9 thus formed fills the terminal-side depressed portion 24, while being laminated on the insulating base layer 8 around the terminal-side depressed portion 24, to have the center portion thereof downwardly depressed from the peripheral end portion thereof. That is, the terminal 14 is formed so as to correspond to the terminal-side depressed portion 24 in the insulating base layer 8.

Each of the plating leads 16 is formed such that one end portion thereof is laminated on the insulating base layer 8, and the other end portion thereof corresponds to the lead-side depressed portion 25. That is, the both longitudinal edge portions of the other end portion of the plating lead 16 are formed to be downwardly bent continuously from one end portion of the plating lead 16 and from the wire 15 so as to cover the both longitudinal end surfaces of the lead-side depressed portion 25.

The thickness of the conductive pattern 9 is in a range of, e.g., 3 to 20 μm, or preferably 5 to 12 μm. The width of each of the conductive patterns 9 is in a range of, e.g., 10 to 100 μm, or preferably 12 to 50 μm. The spacing between the individual conductive patterns 9 is in a range of, e.g., 10 to 100 μm, or preferably 12 to 50 μm.

Next, as shown in FIG. 3(f), the insulating cover layer 10 is formed in a predetermined pattern formed with the cover-side opening 19. As an insulating material for forming the insulating cover layer 10, the same insulating material as used to form the insulating base layer 8 is used. Preferably, photosensitive polyimide is used. To form the insulating cover layer 10, the same method as used to form the insulating base layer 8 is used.

The thickness of the insulating cover layer 10 is in a range of, e.g., 2 to 20 μm, or preferably 3 to 10 μm.

Next, in a first etching step of the method, the metal supporting board 7 is etched, and then the insulating base layer 8 is etched to expose each of the terminals 14 and each of the plating leads 16 from the metal supporting board 7 and the insulating base layer 8.

In this step, as shown in FIG. 3(g), the substrate-side openings 11 are formed first in the metal supporting board 7 so as to expose the lower surface of the insulating base layer 8 formed with the terminal-side depressed portions 24 and the lead-side depressed portions 25 from the metal supporting board 7.

To form the substrate-side openings 11, the metal supporting board 7 is etched inside the range in which the insulating base layer 8 is formed when the insulating base layer 8 is projected so as to expose the lower surface of the insulating base layer 8 formed with the terminal-side depressed portions 24 and the lead-side depressed portions 25.

The metal supporting board 7 may be etched appropriately by a known method. For example, after the metal supporting board 7 except for the portion where the substrate-side opening 11 is to be formed is entirely masked, the metal supporting board 7 is chemically etched.

The widthwise length of the substrate-side opening 11 closer to the terminals 14 is in a range of, e.g., 0.2 to 1 mm, or preferably 0.3 to 1 mm. The widthwise length of the substrate-side opening 11 closer to the metal leads 16 is in a range of, e.g., 0.2 to 1 mm, or preferably 0.3 to 1 mm. The longitudinal length of the substrate-side opening 11 closer to the terminals 14 is in a range of, e.g., 0.2 to 5.4 mm, or preferably 0.5 to 5.4 mm. The longitudinal length of the substrate-side opening 11 closer to the metal leads 16 is in a range of, e.g., 0.05 to 0.5 mm, or preferably 0.07 to 0.5 mm.

Next, as shown in FIG. 3(h), the portions of the insulating base layer 8 exposed from the substrate-side openings 11 where the terminal-side depressed portions 24 and the lead-side depressed portions 25 are formed are etched till the respective lower surfaces of the terminal 14 and the plating lead 16 are exposed.

The insulating base layer 8 may be etched appropriately by a known method. For example, the insulating base-layer 8 is etched by chemical etching, plasma etching, or the like. Preferably, the insulating base layer 8 is etched by plasma etching.

In the plasma etching, the lower surface of the insulating base layer 8 exposed from the substrate-side openings 11 is etched using the metal supporting board 7 as a mask. For example, an RF plasma is generated by disposing a sample between opposing electrodes in an atmosphere of encapsulated gas. Examples of the gas to be used for plasma etching include He, Ne, Ar, Xe, Kr, $N_2$, $O_2$, $CF_4$, and $NF_3$. Preferably, Ar, $O_2$, $CF_4$, or $NF_3$ is used. These gases may also be used as a mixture thereof. A gas pressure (degree of vacuum) is in a range of, e.g., 0.5 to 200 Pa, or preferably 10 to 100 Pa. Conditions for generating the RF plasma are such that a frequency is in a range of, e.g., 10 kHz to 20 MHz, or preferably 10 kHz to 100 kHz, and a processing power is in a range of, e.g., 0.5 to 10 W/cm$^2$, or preferably 1 to 5 W/cm$^2$. When the frequency is in the range of 10 kHz to 100 kHz, the matching (the tuning of a resistance value) of a plasma etching apparatus is easily performed. Under such atmospheric conditions, the sample is placed on an electrode controlled to fall within a temperature range of 0 to 120° C., or preferably 10 to 80° C., and processing is performed for a predetermined period corresponding to respective thicknesses between the lower surface of the insulating base layer 8 and the terminal 14 and between the terminal 14 and the lower surface of the plating lead 16.

When the portions of the insulating base layer 8 where the terminal-side depressed portions 24 and the lead-side depressed portions 25 are formed are etched, lower-side openings 12 and upper-side openings 13 are formed.

Thereafter, in the case where the conductive pattern 9 is formed by the additive method, though not shown, the metal thin film exposed from the metal supporting board 7 and the insulating base layer 8 are removed by etching.

In this manner, the other end portions of the plating leads 16 and the lower surfaces of the terminals 14 are simultaneously exposed from the metal supporting board 7 and the insulating base layer 8.

The length of the lower opening 12 in the thickness direction is in a range of, e.g., 1 to 5 μm, or preferably 2 to 4 μm. The length of the upper opening 13 in the thickness direction is in a range of, e.g., 5 to 9 μm, or preferably 6 to 8 μm.

Next, in a plating step of the method, the both surfaces of the exposed terminals 14 are plated with power supplied from the plating leads 16.

In this step, as shown in FIG. 4(i), metal plating layers 17 are simultaneously formed on the both upper and lower surfaces (and the both side surfaces not shown) of the exposed terminals 14. The metal plating layers 17 are formed with power supplied from the plating lead 16 by electrolytic plating. The metal used for plating is not particularly limited, and known metal can be used. Preferably, electrolytic nickel plating and electrolytic gold plating are successively performed to form a gold plating layer on a nickel plating layer.

Preferably, the thicknesses of the nickel plating layers and the gold plating layers are each in a range of about 1 to 5 μm.

Next, in a second etching step of the method, the metal supporting board 7 is trimmed to form the trench portion 4 along the outer periphery of the metal supporting board 7, while the exposed metal lead 16 is etched.

In this step, dry film photoresists 26 are formed first over the entire upper and lower surfaces of the suspension board with circuit 6, as shown in FIG. 4(j). Then, as shown in FIG. 4(k), the dry film photoresist 26 is formed into a pattern by known photoprocessing involving exposure and development so as to expose the other end portions of the plating leads 16, and the lower surface of the portion of the metal supporting board 7 where the trench portion 4 is to be formed.

Next, as shown in FIG. 4(l), the other end portions of the plating leads 16 and the metal supporting board 7 which are exposed from the dry film photoresists 26 are removed by etching. For the etching, a wet etching (chemical etching) method is used which uses, e.g., an aqueous ferric chloride solution as an etchant, and performs spraying or dipping.

Next, as shown in FIG. 4(m), the dry film photoresist 26 is removed by etching or stripping, whereby the suspension board with circuit 6 is obtained.

In the method, the insulating cover layer 10 in which the cover-side opening 19 is bored is formed to expose the terminals 14 in the laminating step, the plating leads 16 are exposed at the same time as the terminals 14 are exposed from the metal supporting board 7 and the insulating base layer 8 in the first etching step, the exposed terminals 14 are plated with power supplied from the plating leads 16 in the plating step, and then the plating leads 16 are etched at the same time as the metal supporting board 7 is trimmed in the second etching step.

Therefore, it is possible to perform the first etching step to expose the plating leads 16 simultaneously with the step of exposing the terminals 14 from the metal supporting board 7, and forming the terminals 14 as flying leads, and then perform the second etching step to etch the plating leads 16 simultaneously with a step of trimming the metal supporting board 7.

As a result, it is unnecessary to provide the step of etching the plating leads 16 as an independent step so that the number of steps is reduced to allow an improvement in production efficiency.

Figure 5:
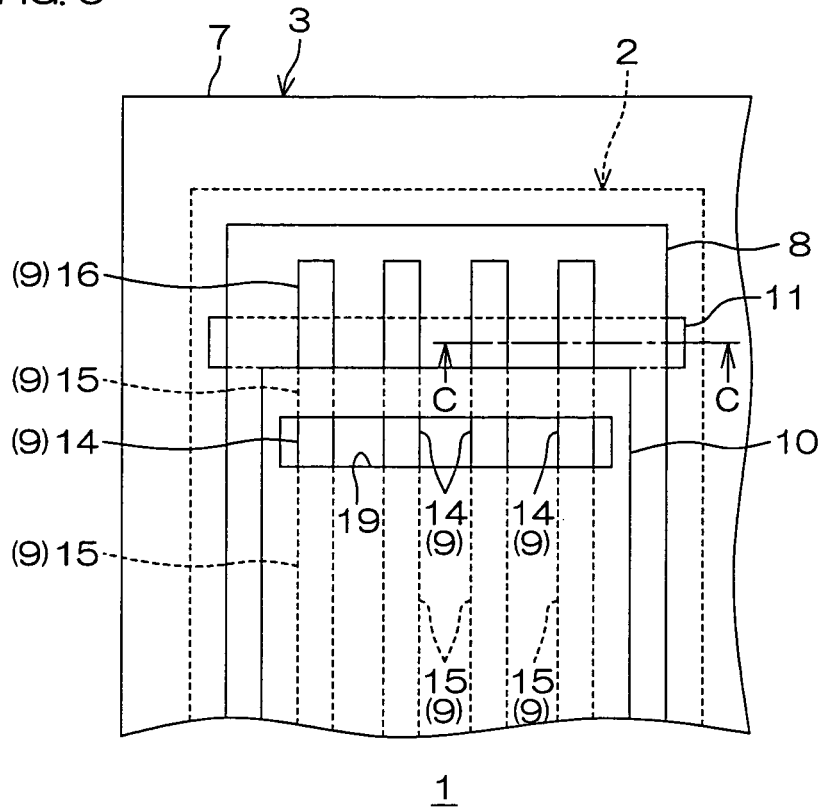
FIG. 5 is a principal-portion plan view showing the case where the metal supporting board is etched to have a width larger than that of the insulating base layer.

In the description given above, the product formation region 2 and the insulating base layer 8 are formed to have the same shape when viewed in plan view. However, in the case where, e.g., the insulating base layer 8 is formed smaller than the product formation region 2 as shown in FIG. 5, when the metal supporting board 7 is etched to have a width larger than that of the insulating base layer 8 in the first etching step, the insulating base layer 8 is not formed on the metal supporting board 7 in the C-C cross-section thereof, as shown in FIG. 6(a).

Figure 6:
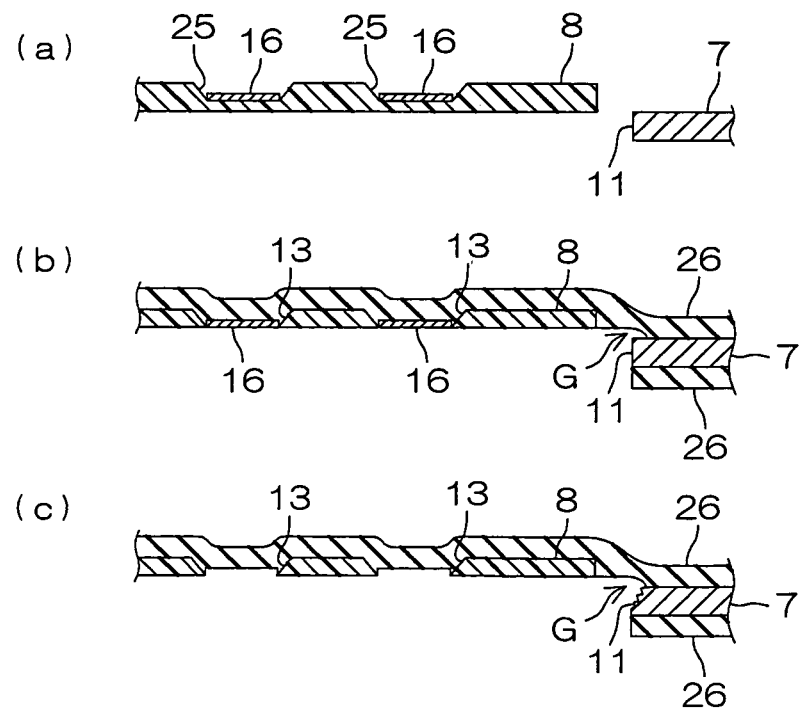
FIG. 6 is a C-C cross-sectional view of the wired circuit board assembly sheet,
   (a) showing a C-C cross-sectional view of the wired circuit board assembly sheet shown in FIG. 6,
   (b) showing a cross-sectional view corresponding to the C-C cross-sectional view in the step shown in FIG. 4(k), and
   (c) showing a cross-sectional view corresponding to the C-C cross-sectional view in the step shown in FIG. 4(m)

Then, when the insulating base layer 8 is etched, and the dry film photoresists 26 are laminated, exposed to light, and developed in the same manner as in the embodiment described above, a gap G is formed at the interface between the metal supporting board 7 and the dry film photoresist 26, as shown in FIG. 6(b). Thereafter, when the plating leads 16 are etched, the upper surface of the metal supporting board 7 exposed from the gap G may be etched, as shown in FIG. 6(c).

However, in the first etching step, the metal supporting board 7 inside the range in which the insulating base layer 8 is formed is etched. Accordingly, as shown in FIG. 7(a), the insulating base layer 8 is formed on the metal supporting board 7 in the cross section corresponding to the B-B cross-sectional view thereof.

Figure 7:
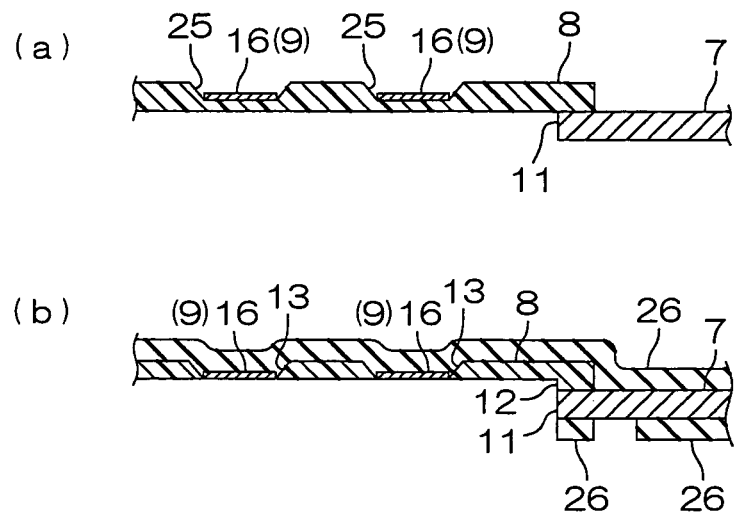
FIG. 7 is a B-B cross-sectional view of the wired circuit board assembly sheet,
   (a) showing a cross-sectional view corresponding to the B-B cross-sectional view in the step shown in FIG. 3(g), and
   (b) showing a cross-sectional view corresponding to the B-B cross-sectional view in the step shown in FIG. 4(k)

As a result, as shown in FIG. 7(b), when the dry film photoresists 26 are exposed to light and developed to be patterned in the second etching step, the insulating base layer 8 covers the upper surface of the metal supporting board 7. Therefore, it is possible to prevent the upper surface of the metal supporting board 7 around the periphery of the substrate-side opening 11 from being etched together with the plating leads 16.

Additionally, in the method, the terminal-side depressed portions 24 and the lead-side depressed portions 25 are formed thin. Therefore, in the first etching step, the insulating base layer 8 to be etched is thin, and an etching time can be reduced. This allows a further, improvement in production efficiency.

Figure 8:
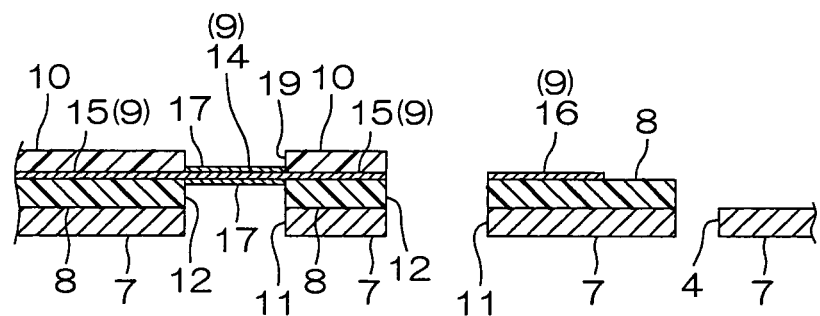
FIG. 8 is a cross-sectional view corresponding to the A-A cross-sectional view, and showing another embodiment of the wired circuit board assembly sheet of the present invention.

In the present embodiment, the terminal-side depressed portions 24 and the lead-side depressed portions 25 are formed in the insulating base layer 8 in the laminating step. However, as shown in FIG. 8, it is also possible to form the insulating base layer 8 having a uniform thickness without forming the terminal-side depressed portions 24 and the lead-side depressed portions 25.

In the present embodiment, the first etching step is performed simultaneously with the step of exposing the terminals 14 from the metal supporting board 7, and forming the terminals 14 as flying leads to expose the plating leads 16. However, in the case where the terminals 14 are not formed as flying leads, the first etching step can be performed simultaneously with the step of forming a tooling hole in the metal supporting board 7.

Figure 9:
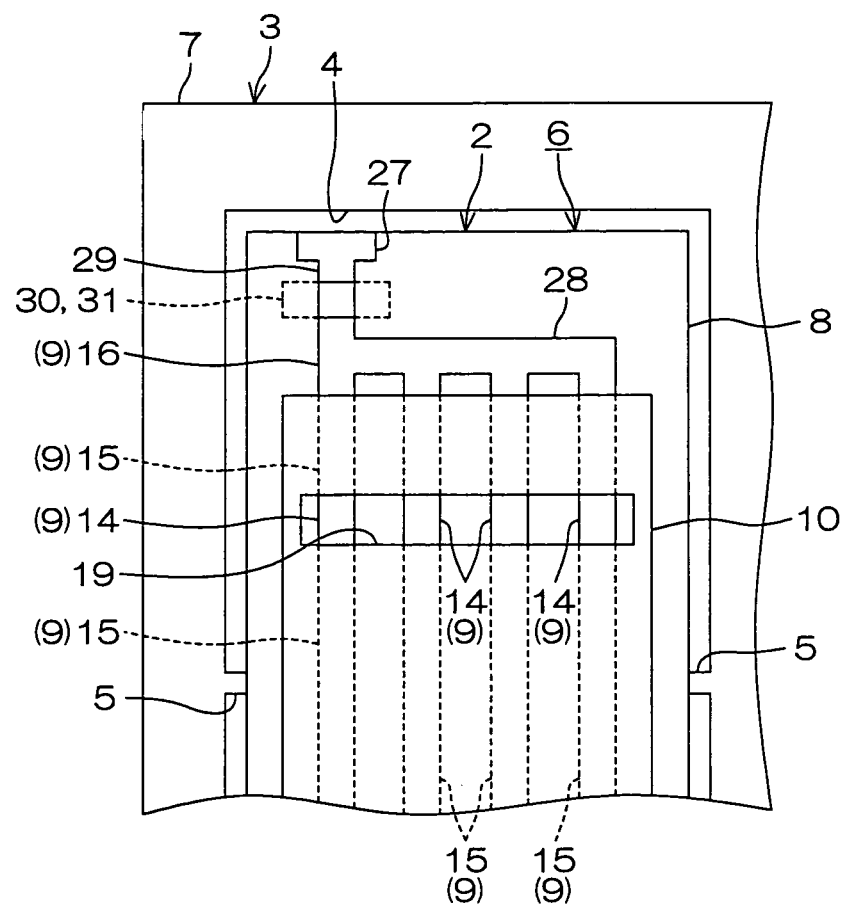
FIG. 9 is a principal-portion plan view showing still another embodiment of the wired circuit board assembly sheet of the present invention.

In the present embodiment, as shown in FIG. 1, the individual plating leads 16 are arranged in spaced-apart relation along the widthwise direction. However, as shown in FIG. 9, it is also possible to integrate the individual plating leads 16 into a single plating lead 16. Then, on one longitudinal end portion of the single integral plating lead 16, a power supplying portion 27 (land) for supplying power in the plating step can be provided.

That is, the individual plating leads 16 are coupled on one longitudinal end portions thereof by a first coupling lead 28 extending in the widthwise direction, and include a second coupling lead 29 extending from one widthwise end portion of the first coupling lead 28 toward one longitudinal end portion. The power supplying portion 27 is provided on one longitudinal end portion of the second coupling lead 29.

In this case, accordingly, the metal supporting board 7 and the insulating base layer 8 are etched so as to expose the lower surface of the second coupling lead 29 in the first etching step to form a substrate-side opening 31 and a lower-side opening 32. Then, in the second etching step, the second coupling lead 29 is cut by etching to cut the power supplying portion 27 away from the suspension board with circuit 6.

In this manner, an area of a portion to be etched in the first etching step and the second etching step can be reduced.

EXAMPLE

First, a metal supporting board made of a stainless steel foil having a thickness of 20 μm was prepared (see FIG. 3(a)).

Then, a solution (varnish) of a precursor (photosensitive polyamic acid resin) of photosensitive polyimide was coated on the entire surface of the metal supporting board, and then dried to form a coating (see FIG. 3(b)). The coating was subjected to gradation exposure (in a negative mode) via a photomask (see FIG. 3(c)). By performing development using an alkaline developer, an insulating base layer formed with terminal-side depressed portions and lead-side depressed portions was formed in a pattern (see FIG. 3(d)). The patterned coating was cured by heating to form the insulating base layer having a generally rectangular shape when viewed in plan view.

The thickness of the insulating base layer was 10 μm, and the thicknesses of the portions of the insulating base layer where the terminal-side depressed portions and the lead-side depressed portions were formed was each 3 μm. The longitudinal length of the terminal-side depressed portion was 3.8 mm, and the widthwise length thereof was 0.5 mm. The longitudinal length of the lead-side depressed portion was 0.1 mm, and the widthwise length thereof was 0.5 mm.

Then, by a sputtering method, a chromium thin film and a copper thin film were successively formed to form a metal thin film on the insulating base layer. Subsequently, a plating resist was formed using a dry film photoresist in a pattern reverse to a conductive pattern on the metal thin film. Then, the conductive pattern was formed by electrolytic copper plating on the metal thin film exposed from the plating resist. Thereafter, the plating resist was removed by wet etching, and then the portion of the metal thin film where the plating resist was formed was removed by stripping to form the conductive pattern including four terminals, four wires, and four plating leads on the insulating base layer (see FIG. 3(e)).

Each of the terminals filled the terminal-side depressed portion, while being laminated on the insulating base layer around the terminal-side depressed portion, to have the center portion thereof downwardly depressed from the peripheral end portion thereof. Each of the plating leads was formed continuously from the front end portion of the plating lead and from the wire to be downwardly bent so as to cover the both longitudinal end surfaces of the upper opening closer to the plating leads.

The thickness of the conductive pattern was 12 μm, and the width thereof was 30 μm. The spacing between the mutually adjacent conductive patterns was 50 μm.

Then, in the same manner as with the insulating base layer, an insulating cover layer made of a polyimide resin having a thickness of 4 μm was formed in a pattern formed with a cover-side opening on the insulating base layer (see FIG. 3(f)).

Then, the metal supporting board was chemically etched using a ferric chloride solution to form substrate-side openings in the metal supporting board such that the insulating base layer formed with the terminal-side depressed portions and the lead-side depressed portions were formed was exposed from the metal supporting board inside the range in which the insulating base layer was formed when the insulating base layer was projected in a layer thickness direction (see FIG. 3(g)).

The widthwise length of the substrate-side opening closer to the terminals was 1.0 mm, while the widthwise length of the substrate-side opening closer to the plating leads was 1.0 mm. The longitudinal length of the substrate-side opening closer to the terminals was 5.4 mm, while the longitudinal length of the substrate-side opening closer to the plating leads was 0.5 mm.

Then, the insulating base layer exposed from the substrate-side openings was plasma etched till the lower surfaces of the terminals and the plating leads were exposed to form lower openings and upper openings (see FIG. 3(h)). Thereafter, the chromium thin film exposed from the metal supporting board and the insulating base layer was removed by etching.

In the plasma etching, the insulating base layer was processed for about 2 minutes using the metal supporting board as a mask, and using a gas mixture of $CF_4$ and $O_2$ ($CF_4/O_2=20/80$) as a filler gas under such conditions that a gas pressure (degree of vacuum) was 25 Pa, a frequency was 13.5 MHz, and a processing power was 3 W/cm$^2$.

The length of the lower opening in the thickness direction was 3 μm, and the length of the upper opening in the thickness direction was 7 μm.

Then, electrolytic nickel plating and electrolytic gold plating were successively performed by supplying power from the plating leads to the individual terminals to form metal plating layers each having a thickness of 4 μm, and including a nickel plating layer and a gold plating layer on the both upper and lower surfaces of the individual terminals and on the both side surfaces thereof (see FIG. 4(i)).

Then, dry film photoresists were laminated on the entire upper and lower surfaces of the suspension board with circuit (see FIG. 4(j)), and formed into a pattern by known photoprocessing involving exposure and development so as to expose the portion of the metal supporting board where a trench portion was to be formed as well as the lower surfaces of the other end portions of the plating leads (see FIG. 4(k)).

Then, the plating leads and the metal supporting board exposed from the dry film photoresists were chemically etched using a ferric chloride solution (see FIG. 4(l)).

Then, the dry film photoresist was removed by etching or stripping, whereby a suspension board with circuit was obtained (see FIG. 4(m)).

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A producing method of a wired circuit board, the producing method comprising:
   a laminating step of preparing a metal supporting board, forming an insulating base layer on the metal supporting board, forming a conductive layer including a terminal portion and a plating lead continued from the terminal portion on the insulating base layer, and forming an insulating cover layer on the insulating base layer so as to cover the conductive layer;
   a first etching step of at least one of: a) etching the metal supporting board, and then etching the insulating base layer to simultaneously expose the lower surface of the plating lead and the lower surface of the terminal portion from the metal supporting board and the insulating base layer, or b) etching the metal supporting board, and then etching the insulating base layer to expose the lower surface of the plating lead from the metal supporting board and the insulating base layer simultaneously with a step of forming of a tooling hole in the metal supporting board;
   a second etching step of etching the exposed plating lead thereby removing the exposed plating lead; and
   a step of trimming the metal supporting board simultaneously with the second etching step.

2. The producing method of the wired circuit board according to claim 1, wherein, in the first etching step, the metal supporting board is etched inside a range in which the insulating base layer is formed when the insulating base layer is projected in a layer thickness direction.

3. The producing method of the wired circuit board according to claim 1, wherein the insulating base layer has a stepped portion corresponding to the plating lead.

4. The producing method of the wired circuit board according to claim 1, wherein
   in the laminating step, the insulating cover layer is formed so as to expose the terminal portion,
   the producing method of the wired circuit board further comprising, after the first etching step and before the second etching step:
   a plating step of plating the exposed terminal portion with power supplied from the plating lead.

* * * * *